(12) United States Patent
Mueller et al.

(10) Patent No.: US 7,977,768 B2
(45) Date of Patent: Jul. 12, 2011

(54) SEMICONDUCTOR DEVICES AND METHODS OF MANUFACTURE THEREOF

(75) Inventors: Karl-Heinz Mueller, Velden (DE); Holger Arnim Poehle, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 445 days.

(21) Appl. No.: 12/060,626

(22) Filed: Apr. 1, 2008

(65) Prior Publication Data
US 2009/0243041 A1    Oct. 1, 2009

(51) Int. Cl.
*H01L 21/761* (2006.01)

(52) U.S. Cl. ............ 257/548; 257/E21.537; 257/330; 257/377; 438/137; 438/268

(58) Field of Classification Search ........... 257/E21.41, 257/E21.476, E29.001, 548, 330, 334, 369, 257/372, 377, 773, E21.537; 438/137, 268, 438/696
See application file for complete search history.

(56) References Cited

U.S. PATENT DOCUMENTS

| | | | |
|---|---|---|---|
| 5,003,365 A | | 3/1991 | Havemann et al. |
| 5,293,053 A | * | 3/1994 | Malhi et al. ............ 257/330 |
| 5,352,915 A | * | 10/1994 | Hutchings et al. ........ 257/361 |
| 5,714,775 A | * | 2/1998 | Inoue et al. ............ 257/139 |
| 5,719,431 A | | 2/1998 | Werner |
| 5,894,149 A | * | 4/1999 | Uenishi et al. ............ 257/331 |
| 5,907,163 A | | 5/1999 | Skebe et al. |
| 6,211,018 B1 | * | 4/2001 | Nam et al. ............ 438/270 |
| 6,281,095 B1 | * | 8/2001 | Bolam et al. ............ 438/462 |
| 6,436,770 B1 | * | 8/2002 | Leung et al. ............ 438/268 |
| 6,800,925 B2 | | 10/2004 | Rossmeier et al. |
| 6,818,947 B2 | * | 11/2004 | Grebs et al. ............ 257/330 |
| 7,109,552 B2 | * | 9/2006 | Wu ............ 257/335 |
| 7,199,403 B2 | * | 4/2007 | Tihanyi ............ 257/106 |
| 7,655,975 B2 | * | 2/2010 | Hirler et al. ............ 257/331 |
| 7,705,408 B2 | * | 4/2010 | Yamamoto et al. ............ 257/401 |
| 2003/0136990 A1 | | 7/2003 | Rossmeier et al. |
| 2005/0110116 A1 | | 5/2005 | Ishio et al. |
| 2008/0102593 A1 | | 5/2008 | Meister et al. |
| 2009/0026572 A1 | | 1/2009 | Dehlinger |
| 2009/0194843 A1 | | 8/2009 | Weyers et al. |

FOREIGN PATENT DOCUMENTS

| | | |
|---|---|---|
| DE | 42 09 523 C1 | 3/1993 |
| DE | 198 40 031 A1 | 3/2000 |
| DE | 199 53 333 A1 | 5/2001 |
| DE | 100 14 659 A1 | 10/2001 |
| DE | 102 02 479 A1 | 8/2003 |
| DE | 10 2006 046 727 A1 | 4/2008 |
| DE | 10 2008 034 789 A1 | 2/2009 |

* cited by examiner

*Primary Examiner* — Chris Chu
(74) *Attorney, Agent, or Firm* — Slater & Matsil, L.L.P.

(57) ABSTRACT

Semiconductor devices and methods of manufacture thereof are disclosed. In one embodiment, a semiconductor device includes a workpiece having a buried layer disposed beneath a top portion thereof. A trench is disposed in the workpiece extending at least through the buried layer. At least one sinker contact is disposed in the top portion of the workpiece. The at least one sinker contact is proximate sidewalls of at least a portion of the trench and is adjacent the buried layer. An insulating material is disposed on the sidewalls of the trench. A conductive material is disposed within the trench and is coupled to a lower portion of the workpiece.

26 Claims, 7 Drawing Sheets

SEMICONDUCTOR DEVICES AND METHODS OF MANUFACTURE THEREOF

TECHNICAL FIELD

The present invention relates generally to the fabrication of semiconductor devices, and more particularly to the formation of sinker contact structures in semiconductor devices.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon, forming an integrated circuit.

The upper material layers of semiconductor devices typically comprise metallization layers that are used to interconnect various electrical devices and elements formed on an integrated circuit (IC). The metallization layers are typically formed in a back end of line (BEOL) of a semiconductor manufacturing process, for example. However, the lower layers of semiconductor devices do not typically contain metal, because some metals may contaminate semiconductive materials in some applications. The fabrication of lower levels of semiconductor devices formed before metallization layers are formed is often referred to as a front end of line (FEOL) of a semiconductor manufacturing process, for example.

Structures that are referred to in the art as "sinker contacts" are often used to make electrical connection in the FEOL to devices formed on a semiconductor workpiece or substrate comprising a conductive buried layer, for example. Sinker contacts are typically formed by implanting or diffusing a dopant into a substrate, and annealing or heating the substrate to drive the dopant deeper into the substrate. The dopant causes the semiconductive material to be more conductive; thus, sinker contacts may be used to make electrical connection to conductive buried layers in the substrate.

Trench contacts are typically used to make electrical contact to a substrate beneath the buried layer. However, trench contacts and sinker contacts comprise differently doped semiconductive materials, which may cause problems during the trench etch due to differently doped silicon areas. If trench contacts are placed close to sinker contacts, crystalline defects such as slip-lines may occur, which are cracks in the crystalline structure of the silicon that may cause electrical problems or device defects and failures. Therefore, trench contacts and sinker contacts must be spaced apart from one another by a relatively large distance, e.g., by about 10 to 15 μm or greater, in order to avoid etch problems, slip-lines, and crystal defects. However, spacing trench contacts and sinker contacts by such large distances requires a large amount of surface area on a chip and limits the amount a semiconductor device may be reduced in size.

Thus, what are needed in the art are improved and more area-efficient sinker contact structures for semiconductor devices and methods of manufacture thereof.

SUMMARY OF THE INVENTION

These and other problems are generally solved or circumvented, and technical advantages are generally achieved, by embodiments of the present invention, which provide novel sinker contact structures and methods of manufacture thereof.

In accordance with an embodiment of the present invention, a semiconductor device includes a workpiece having a buried layer disposed beneath a top portion thereof. A trench is disposed in the workpiece extending at least through the buried layer. At least one sinker contact is disposed in the top portion of the workpiece. The at least one sinker contact is proximate sidewalls of at least a portion of the trench and is adjacent the buried layer. An insulating material is disposed on the sidewalls of the trench. A conductive material is disposed within the trench and is coupled to a lower portion of the workpiece.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely, in the formation of sinker contacts in semiconductor devices. Embodiments of the present invention may also be applied, however, to other electrical connection structures and methods of formation thereof in semiconductor devices.

Embodiments of the present invention provide novel semiconductor devices that comprise novel sinker contacts and trench rings. The sinker contacts are formed adjacent sidewalls of the trench rings, providing novel space-saving compact sinker contact structures. The sinker contacts provide electrical connection to a buried layer of a workpiece, and a conductive material within the trench ring provides electrical connection to the substrate beneath the buried layer.

Novel combination sinker contact/trench ring structures are disclosed, wherein a portion of the trench ring is etched into a workpiece, and then sinker contacts are formed. The remainder of the trench ring is then etched. The sinker contacts are formed after a partial etch of the trench ring, avoiding the need to etch through differently-doped semiconductive materials, to be described further herein, and providing the ability to place the sinker contacts proximate the trench ring, e.g., adjacent sidewalls of the trench ring, also to be described further herein.

Figure 1:
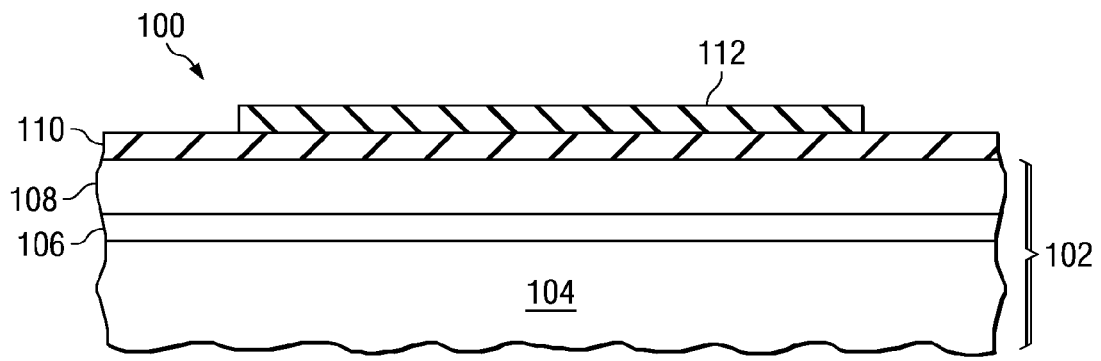
FIGS. 1 through 5 show cross-sectional views of a semiconductor device at various stages of manufacturing in accordance with an embodiment of the present invention, wherein a trench ring is partially formed in a top portion of a workpiece.

Embodiments of the present invention will next be described with reference to FIGS. 1 through 19. FIGS. 1 through 5 show cross-sectional views of a semiconductor device 100 at various stages of manufacturing in accordance with an embodiment of the present invention, wherein a trench ring 122 is formed in a top portion of the workpiece 102. Referring first to FIG. 1, a workpiece 102 is provided. The workpiece 102 may include a semiconductor substrate 104 comprising silicon or other semiconductor materials, for example. The substrate 104 may also include other active components or circuits, not shown. The substrate 104 may comprise single-crystal silicon, for example. The substrate 104 may include other conductive layers or other semiconductor elements, e.g., transistors, diodes, etc. Compound semiconductors, GaAs, InP, Si/Ge, or SiC, as examples, may be used in place of silicon. The substrate 104 may comprise a silicon-on-insulator (SOI) substrate or germanium-on-insulator (GOI) substrate, as examples. The substrate 104 is also referred to herein as a first semiconductive material.

The workpiece 102 includes a buried layer 106 formed over the substrate 104, as shown in FIG. 1. The buried layer 106 is also referred to herein as a second semiconductive material. A third semiconductive material 108 comprising a top portion of the workpiece 102 is disposed over the buried layer 106.

The buried layer 106 may comprise a conductive layer that may be formed by implantation of at least one dopant or by in-situ deposition of a doped semiconductive material, as examples, followed by an anneal process, although the buried layer 106 may be formed using other methods. The buried layer 106 may comprise a thickness of about 2 to 5 μm, for example, although the buried layer 106 may also comprise other dimensions. The thickness of the buried layer 106 may vary as a function of the doping concentration of the implanted dopant and/or the temperature of an anneal process used to form the buried layer 106, for example. The buried layer 106 may optionally comprise a pattern, not shown. For example, in a top view of the semiconductor device 100, the buried layer 106 may be rectangular, angled, meandering, or other shapes.

The third semiconductive material 108 comprises a top portion of the workpiece 102 that resides above the buried layer 106, as shown. The third semiconductive material 108 may be formed by epitaxial growth of a semiconductive material on top of the implanted buried layer 106, as an example. Another alternative method of forming the buried layer 106 is by directly implanting the buried layer 106 deep into the workpiece 102 using high-energy implantation followed by an anneal process, for example. The third semiconductive material 108 may comprise a thickness of about 5 μm, and may comprise a thickness of about 1 to 10 μm in some embodiments, for example, although alternatively, the third semiconductive material 108 of the workpiece 102 may comprise other dimensions.

In some embodiments, the substrate 104 may comprise a p− substrate, e.g., comprising a semiconductor wafer comprising silicon doped with a p− type dopant such as boron. The buried layer 106 may comprise n+ doped silicon, e.g., doped with arsenic or antimony, and the third semiconductive material 108 may comprise n− doped silicon, e.g., doped with arsenic or phosphorus, in these embodiments. The sinker contact material (not shown in FIG. 1; see semiconductive material 130 shown in FIG. 8) may comprise n+ doped silicon, e.g., doped with phosphorus, and the trench ring 122 fill material (not shown in FIG. 1; see conductive material 140 shown in FIGS. 15 and 16) may comprise a p+ type material doped with boron in these embodiments, for example.

However, alternatively, in other embodiments, the substrate 104 may comprise an n-substrate, e.g., comprising a semiconductor wafer comprising silicon doped with an n− type dopant such as arsenic or phosphorus. The buried layer 106 may comprise p+ doped silicon, e.g., doped with boron, and the third semiconductive material 108 may comprise p− doped silicon, e.g., doped with boron, in these embodiments. The sinker contact 130 material may comprise p+ doped silicon, e.g., doped with boron, and the trench ring 122 fill material 140 may comprise an n+ type material doped with arsenic in these embodiments, for example.

The types of doping of the substrate 104, buried layer 106, third semiconductive material 108, sinker contacts 130, and trench ring fill material 140 may alternatively comprise other dopant types, for example. In some embodiments, the doping type of the substrate 104, third semiconductive material 108, and the trench ring fill material 140 comprises a first type, and the doping type of the buried layer 106 and the sinker contact material 130 comprises a second type, wherein the second type is different than the first type, for example. The first type may be p type and the second type may be n type, or the first type may be n type and the second type may be p type, for example.

In some embodiments, the substrate 104, the third semiconductive material 108, and the trench ring fill material 140 comprise a first conductivity type, and buried layer 106 and the sinker contact material 130 comprise a second conductivity type, wherein the second conductivity type is different than the first conductivity type, for example.

The buried layer 106 may comprise a sheet layer that is heavily doped so that it is conductive. The buried layer 106 may be coupled to an active area (not shown in the drawings) of the workpiece 102. The active area may comprise a portion of a transistor, e.g. a bipolar transistor or drain extended MOS (DMOS), a high voltage, or a low voltage transistor. The active area may comprise a portion of a transistor, diode, capacitor, logic device, memory device, other circuit elements, or combinations thereof, as examples. The active area coupled to the buried layer 106 may be formed in the workpiece 102, e.g., before or after the manufacturing processing steps described herein. It is an object of the present invention to make electrical contact to the buried layer 106 by forming a sinker contact 130, for example, to be described further herein.

Next, an insulating material 110 is formed over the workpiece 102, as shown in FIG. 1. The insulating material 110 may be formed by exposing the workpiece 102 to oxygen, oxidizing the top surface of the third semiconductive material 108. Alternatively, the insulating material 110 may be formed by depositing an oxide or other material, e.g., using a chemical vapor deposition (CVD) or other process. The insulating material 110 may alternatively comprise an oxide, a nitride, or combinations or multiple layers thereof, for example. In some embodiments, the insulating material 110 comprises silicon dioxide. The insulating material 110 may comprise a thickness of about 50 nm or less, although alternatively, the insulating material 110 may comprise other dimensions.

Isolation regions 114 are formed, e.g., using a LOCal Oxidation of Silicon (LOCOS) method or other methods. Isolation regions 114 may comprise field oxide regions, shallow trench isolation (STI) regions, or thick oxide regions, for example. To form the isolation regions 114 using a LOCOS method, for example, a masking material 112 is formed over the workpiece 102. The masking material 112 may comprise a hard masking material comprising a different material than the insulating material 110, for example. The masking material 112 may comprise a nitride material such as silicon nitride if the insulating material 110 comprises silicon dioxide, as one example. The masking material 112 is patterned, e.g., by depositing a layer of photosensitive material (not shown) such as a photoresist over the masking material 112. The layer of photosensitive material is patterned using a lithography process; e.g., by exposure to light or radiation to transfer a pattern from a lithography mask (not shown) to the layer of photosensitive material, and the photosensitive material is developed. The layer of photosensitive material is then used as an etch mask while portions of the masking material 112 are etched away, leaving the structure shown in FIG. 1.

Figure 2:
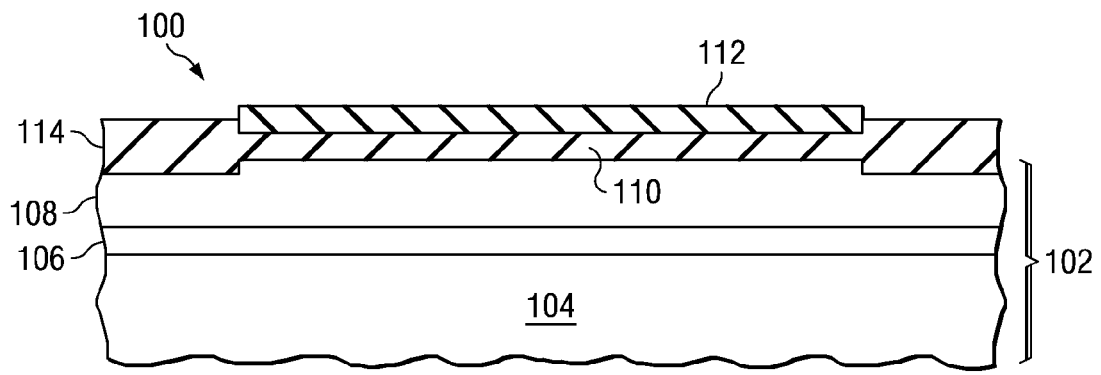
Figure 3:
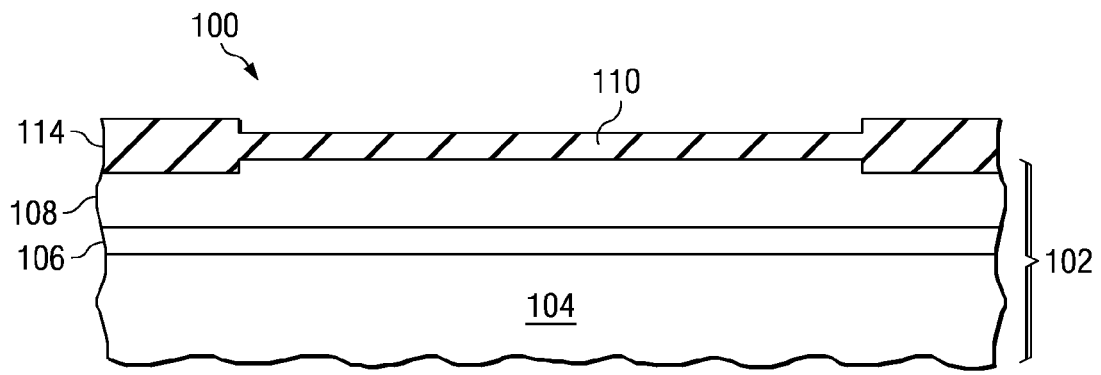

Exposed portions of the insulating material layer 110 are oxidized to increase the thickness of the insulating material layer 110. For example, the insulating material layer 110 may be exposed to an oxygen-containing substance, a silicon-containing substance, and/or increased temperature to increase the thickness of the insulating material layer 110, as shown in FIG. 2, forming isolation regions 114. The isolation regions 114 comprise a thick oxide grown in the field regions of the semiconductor device 100 while active device regions are protected by the masking material 112, for example. The isolation regions 114 may isolate adjacent devices or active areas from one another, for example, not shown. The masking material 112 is then removed, as shown in FIG. 3.

The isolation regions 114 may also be formed using other methods. The isolation regions 114 may be formed before or after the formation of the sinker contacts 130 and trenches 122.

Figure 4:
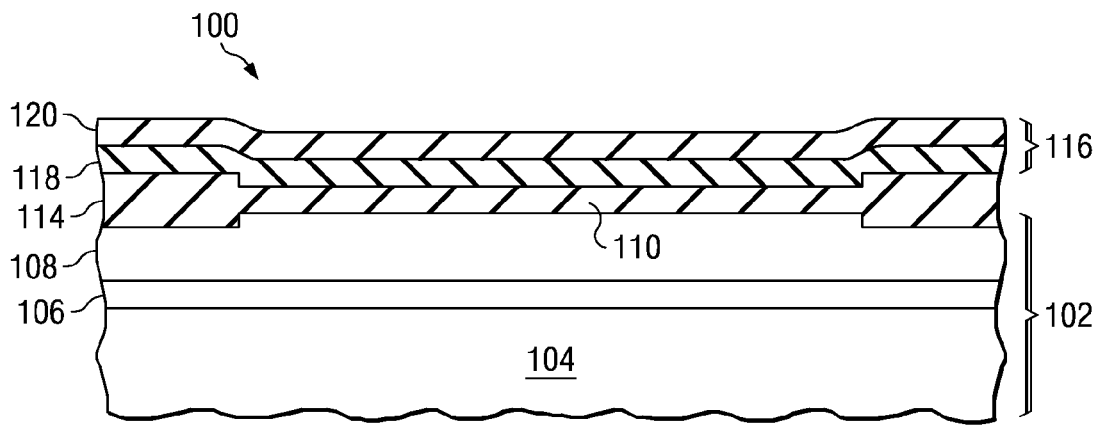

Next, trenches 122 are formed in a top portion of the workpiece 102, e.g., within the third semiconductive material 108, extending at least to the buried layer or second semiconductive material 106. The trenches 122 are partially formed within the workpiece 102 to a first depth, wherein the first depth comprises the thickness of the hard mask 116, the insulating material 110, and the third semiconductive material 108. To form the trenches 122, a hard mask 116 is formed over the isolation regions 114 and the thin insulating material 110, as shown in FIG. 4. The hard mask 116 may comprise one, two, or more material layers. In the embodiment shown, the hard mask 116 comprises two material layers 118 and 120, for example. Material layer 118 may comprise a nitride material layer, and material layer 120 may comprise an oxide material layer, for example. Material layer 118 may comprise silicon nitride, and material layer 120 may comprise tetra ethyl oxysilane (TEOS) in some embodiments, for example. Material layer 120 may comprise a different material than material layer 118, and may comprise a material having an etch selectivity to the material of material layer 118, for example. Alternatively, material layers 118 and 120 may comprise other materials.

Figure 5:
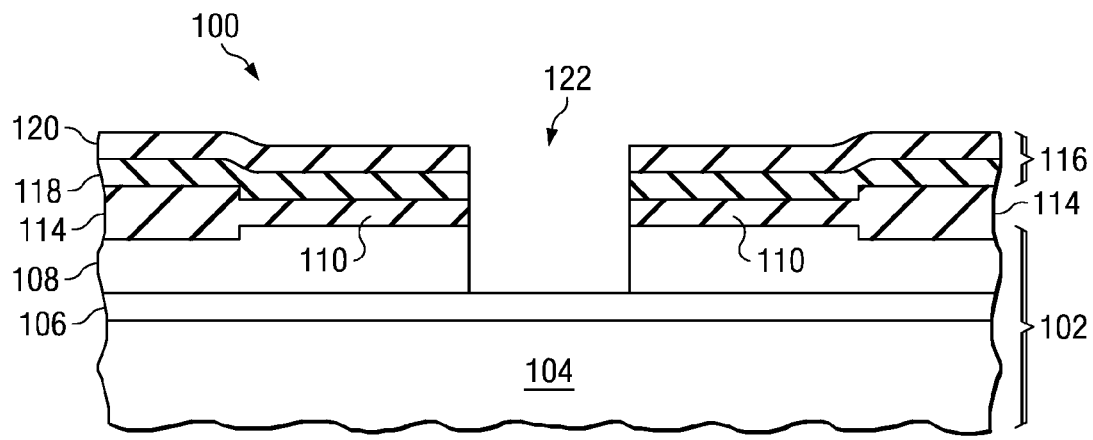

The hard mask 116 is patterned using lithography with a pattern for at least one trench 122, and exposed portions of a top portion of the workpiece 102 are etched away using the patterned hard mask 116 as mask, as shown in FIG. 5, patterning the top portion of the workpiece 102 with at least one trench 122. Only a portion of a trench 122 is shown in the cross-sectional view of FIG. 5. The trench 122 may comprise a trench ring, as shown in a top view in FIG. 6. Only one trench 122 is shown in FIGS. 5 and 6; however, a plurality of trenches 122, e.g., dozens, hundreds, or thousands of trenches 122 may be formed simultaneously across the surface of the semiconductor device 100 in some applications, not shown.

The etch process to form the trench 122 may comprise a wet or dry etch process, for example, and may comprise a reactive ion etch (RIE) process in some embodiments, for example. The etch process may be anisotropic, isotropic, or a combination thereof, for example. The etch process to form the trench 122 may be adapted to stop on the second semiconductive material 106, exposing a top surface of the second semiconductive material 106, as shown. Alternatively, a timed etch process may be used. In some embodiments, a top portion, e.g., a few nm, of the second semiconductive material 106 may be removed during the etch process to form the trench 122, for example, not shown. The trench 122 extends completely through the third semiconductive material 108 of the workpiece 102, as shown in FIG. 5.

The trench 122 may comprise a width in a cross-sectional view comprising dimension $d_1$ of about 2 to 3 µm, and the trench 122 may extend lengthwise, e.g., in and out of the paper as shown in FIG. 5 by about several µm to about 1 mm or greater, for example. The trench 122 may comprise a trench ring as shown in the top view of FIG. 6, wherein the trench ring 122 comprises a width comprising dimension $d_2$ in a top view of about 20 µm or greater and a length comprising dimension $d_3$ in a top view of about 20 µm or greater, as examples. Alternatively, dimensions $d_1$, $d_2$, and $d_3$ may comprise other values, depending on the size of trench 122 or trench ring 122 desired, for example.

Figure 6:
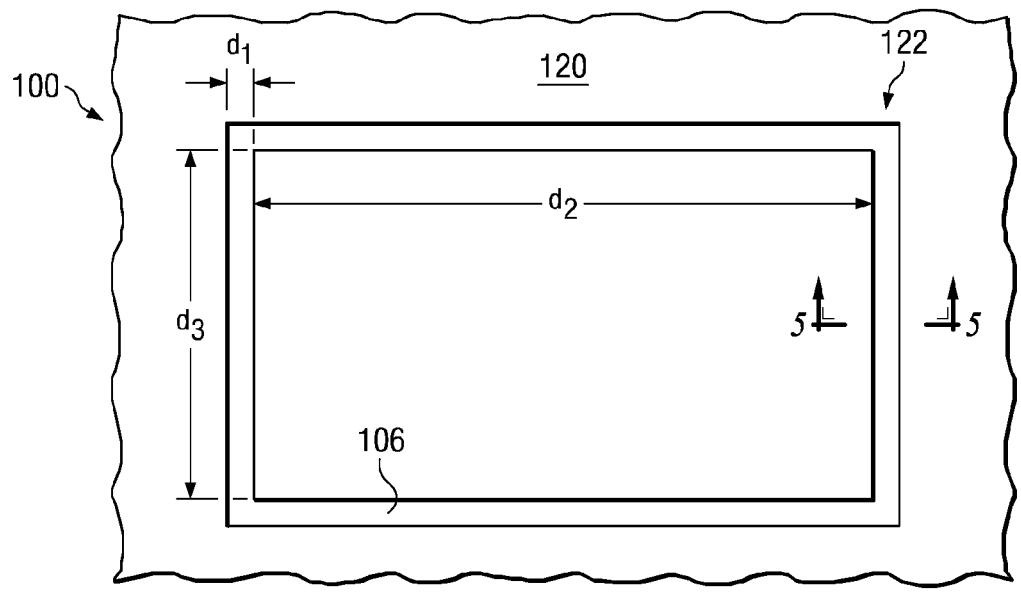
FIG. 6 shows a top view of the semiconductor device shown in FIG. 5.

The sides of the trench ring 122 may extend in substantially straight lines as shown in FIG. 6, or they may comprise arbitrary shapes or paths, e.g., they may be cornered or meandering. The trench 122 may comprise a rectangular trench ring, as shown in the top view of FIG. 6, although alternatively, the trench 122 may be L-shaped, S-shaped, square, circular, elliptical, triangular, trapezoidal, hexagonal, or other shapes across a surface of the workpiece 102, for example.

The trench 122 may comprise a trench ring 122 comprising a shape that encapsulates a portion of the workpiece 102. The trench ring 122 may comprise a continuous loop, wherein the trench ring 122 is disposed about and encloses a portion of the workpiece 102, as shown.

Figure 7:
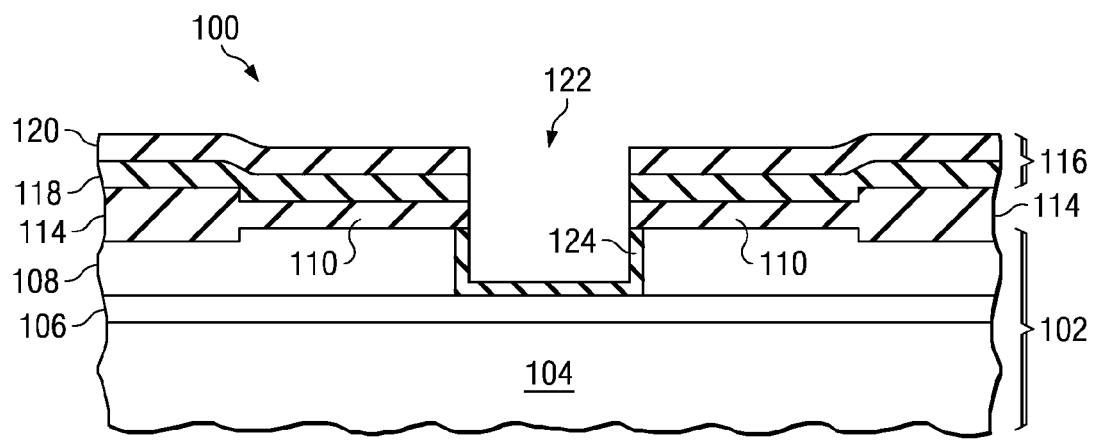
FIG. 7 shows an optional manufacturing step wherein regions of the trench ring are lined with an insulating material before the formation of sinker contacts.

Next, in an optional step, predetermined regions of the workpiece 102 may be oxidized, as shown in FIG. 7 in a cross-sectional view. The workpiece 102 may be exposed to oxygen to form an oxide material 124 on the sidewalls of the trench 122 within the third semiconductive material 108 and over the top surface of the second semiconductive material 106. The oxide material 124 may comprise a thickness of about 100 nm or less, for example, although alternatively, the oxide material 124 may comprise other dimensions.

Some regions or portions of the workpiece 102 (e.g., some regions or portions of the trench 122) may be masked while the unmasked regions are either implanted through the oxide material 124, or wherein portions of the oxide material 124 are etched away. For example, a layer of photoresist (not shown) may be formed over the workpiece 102 and patterned using lithography to expose the regions or portions of the trench 122 that will be doped (e.g., with an n type dopant) or etched away. After the oxide material 124 is etched away from portions of the trench 122 or after portions of the trench are doped, the layer of photoresist is then removed.

The optional oxide material 124 is omitted in embodiments wherein sinker contacts will be formed along the entire perimeter and inside diameter of the trench ring 122, for example. The oxide material 124 is used when one or more sinker contacts will be formed along a portion the trench ring 122, for example, to be described further herein.

Figure 8:
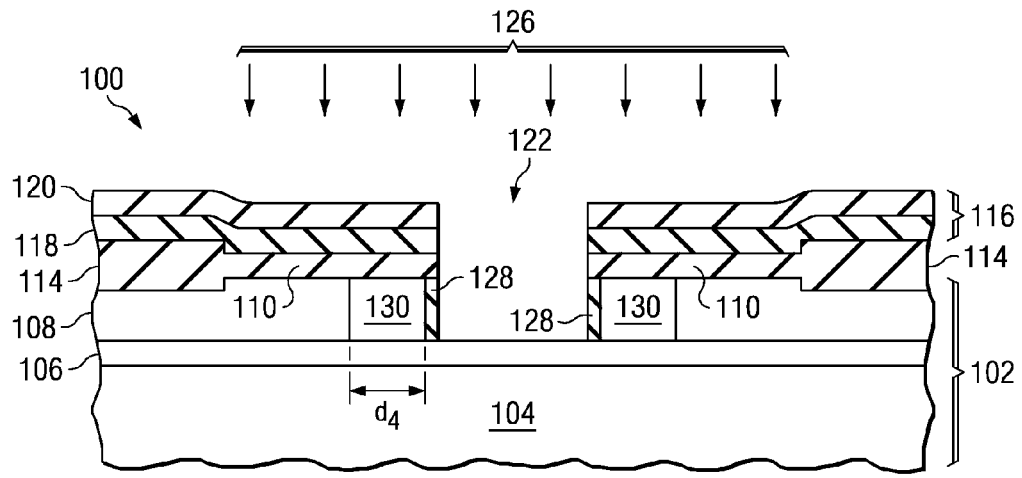
FIGS. 8 through 11 show cross-sectional views of the semiconductor device wherein sinker contacts are formed proximate the trench ring sidewalls in the top portion of the workpiece, and an insulating material is formed over the sinker contacts.
Figure 9:
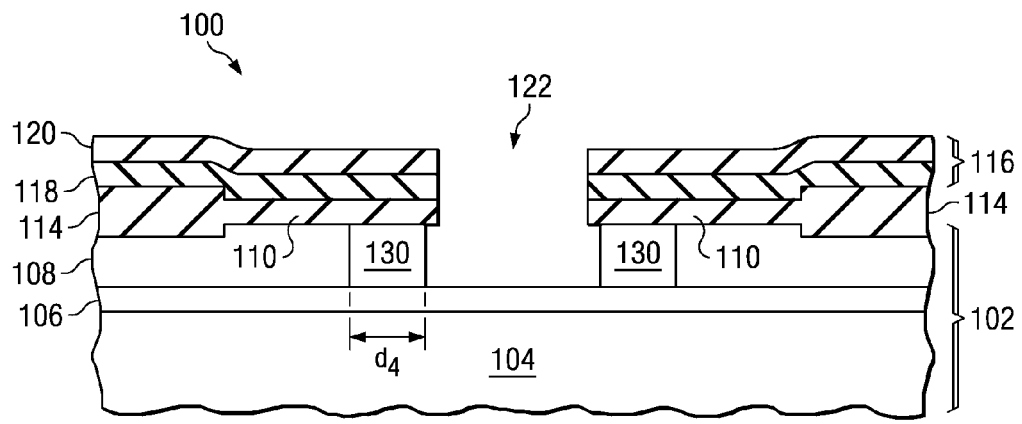

Next, at least one sinker contact 130 is formed in the top portion of the workpiece 102, e.g., within the third semiconductive material 108, as shown in FIG. 8. The at least one sinker contact 130 is formed by implanting or diffusing at least one dopant 126 into the exposed sidewalls of the third semiconductive material 108, forming the at least one sinker contact 130 proximate the sidewalls of at least a portion of the trench 122. The hard mask 116 protects regions that are spaced away from the sidewalls of the trench 122 from being implanted with the dopant 126.

The dopant 126 implantation process may comprise at least one dopant 126 such as phosphorus, which is used to form a high conductivity region within the third semiconductive material 108 that forms the sinker contacts 130. Alternatively, other dopants may also be used, such as boron or arsenic. The workpiece 102 may be annealed to drive the dopant 126 further, e.g., laterally, into the third semiconductive material 108. The workpiece 102 may be heated to a temperature of about 1,000 degrees C. or greater for about an hour or more, although other temperatures and time durations may also be used for the anneal process used to laterally diffuse the dopant 126 of the sinker contacts 130 within the top portion of the workpiece 102.

The sinker contacts 130 may comprise a width comprising dimension $d_4$ in a cross-sectional view on either side of the trench 122 of about 1 to 2 µm, for example, although alternatively, dimension $d_4$ may comprise other values. The sinker contacts 130 may comprise a dimension $d_4$ that is sufficiently large to land a contact or via on in a subsequent manufacturing process (e.g., such as contacts or vias 148 shown in FIG. 19). The width or dimension $d_4$ may be a function of the thickness of the epitaxially formed third semiconductor material 108 and the dopant concentration of the sinker contacts 130, for example.

A doped insulating material 128 may be formed during the dopant, e.g., phosphorus, diffusion and anneal processes used to form the sinker contacts 130, as shown in FIG. 8. The doped insulating material 128 may comprise phosphorus glass, phosphosilicate glass (PSG), or other doped insulating materials, for example. The doped insulating material 128 is removed using an etch process, leaving the structure shown in FIG. 9.

The sinker contacts 130 comprise conductive regions that provide electrical connection from a top surface of the workpiece 102 to the buried layer 106. The sinker contacts 130 are formed on all exposed sidewalls of the third semiconductive material 108 along the trench ring 122. If in embodiments wherein the sinker contacts 130 are formed by diffusion, the optional oxide material 124 shown in FIG. 7 is left in some regions of the trench ring 122, the sinker contacts 130 are not formed in the regions having the oxide material 124 within the trench ring 122.

The sinker contacts 130 comprise a fourth semiconductive material, wherein the fourth semiconductive material may comprise the same doping type and/or conductivity type as the second semiconductive material or buried layer 106, for example.

Figure 10:
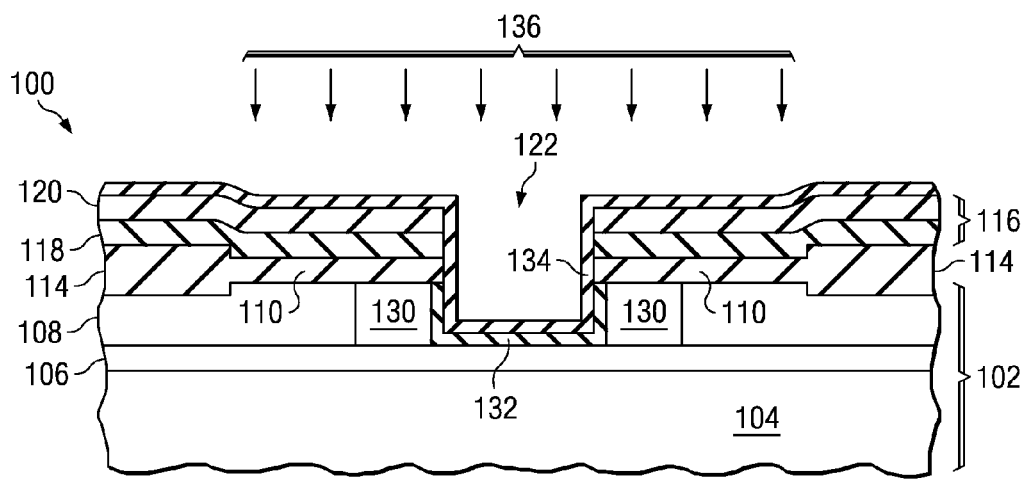

An optional insulating liner 132 may be formed over the exposed sidewalls of the sinker contacts 130 and the exposed top surface of the second semiconductive material 108, as shown in FIG. 10. The insulating liner 132 is also referred to herein as an insulating material. The insulating liner 132 may comprise an oxide material disposed over the sidewalls of the sinker contacts 130 and the exposed top surface of the second semiconductive material 108. The insulating liner 132 may be formed by oxidation, for example, although a deposition process may also be used to form the insulating liner 132. The insulating liner 132 may comprise a thickness of about 100 nm or less, for example. Alternatively, the optional insulating liner 132 may comprise other materials and dimensions.

An insulating material 134 is formed over the top surface of the hard mask 116 and on the sidewalls and bottom surface of the trench 122, as shown in FIG. 10. The insulating material 134 may comprise about 100 nm of TEOS, as an example, although alternatively, the insulating material 134 may comprise other dimensions and materials. The insulating material 134 is also referred to herein as a sacrificial material layer.

Figure 11:
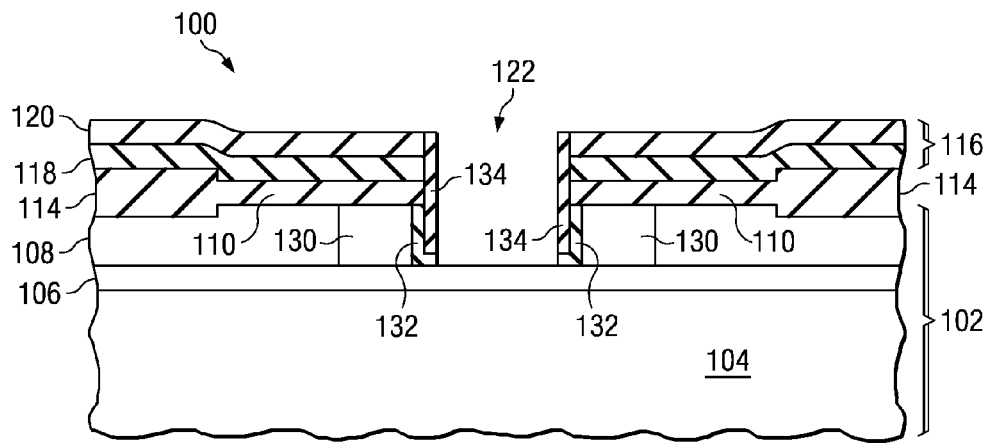

The workpiece 102 is exposed to an etch process 136, as shown in FIG. 10, wherein the etch process 136 comprises an anisotropic, directional etch process adapted to remove the insulating material 134 from the top surfaces of the workpiece 102, e.g., from over the hard mask 116 and also from over the bottom surface of the trench 122, e.g., from over the top surface of the buried layer 106, leaving the insulating material 134 on the sidewalls of the trench 122, as shown in FIG. 11. The optional insulating liner 132, if present, is also removed from the bottom of the trench 122 during the etch process 136, as shown, leaving the top surface of the second semiconductive material 106 within the lower portion of the trench 122 exposed.

Figure 12:
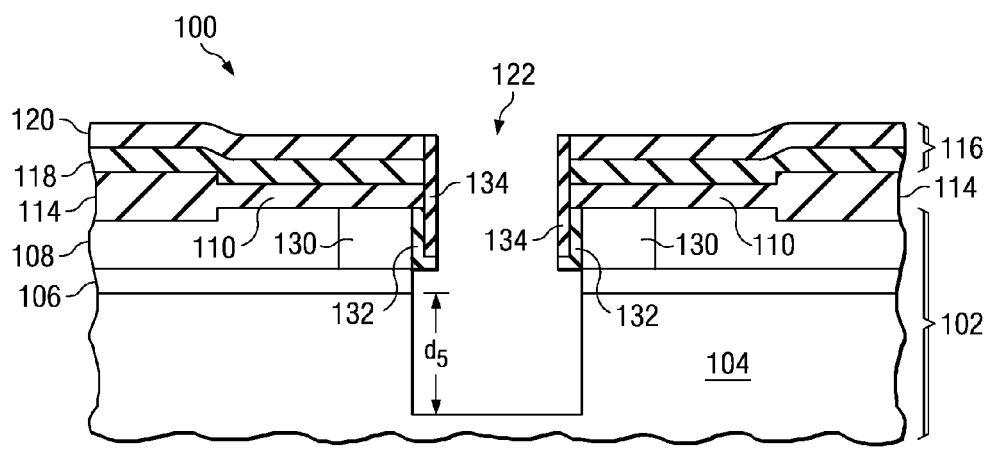
FIG. 12 shows a cross-sectional view of the semiconductor device, wherein the trench ring is etched to extend the trench ring further into the workpiece.

An etch process is then used to fully or completely form the trench ring 122 to a second depth within the workpiece 102, wherein the second depth is greater than the first depth, as shown in FIG. 12. The second depth of the trench ring 122 includes the first depth (e.g., within the hard mask 116, the insulating material 110, and the third semiconductive material 108) and also includes the thickness of the second semiconductive material 106 and optionally, a top portion of the first semiconductive material 104. The trench ring 122 may extend into the top portion of the first semiconductive material 104 by a dimension $d_5$ comprising about 0 to 5 μm, for example, although alternatively, dimension $d_5$ may comprise other values.

The insulating material 134 and optional insulating liner 132 on the sidewalls of the sinker contacts 130, the hard mask 116, and the oxide material 110 within the trench 122 protects the upper portion of the trench 122 from being etched in the etch process used to extend the trench ring 122 further into the workpiece 102, e.g., to the second depth.

At least the top surface of the first semiconductive material 104 is exposed after the etch process to deepen the trench 122. The trench 122 may also be extended within the first semiconductive material 104 by the dimension $d_5$, as shown in FIG. 12.

Figure 13:
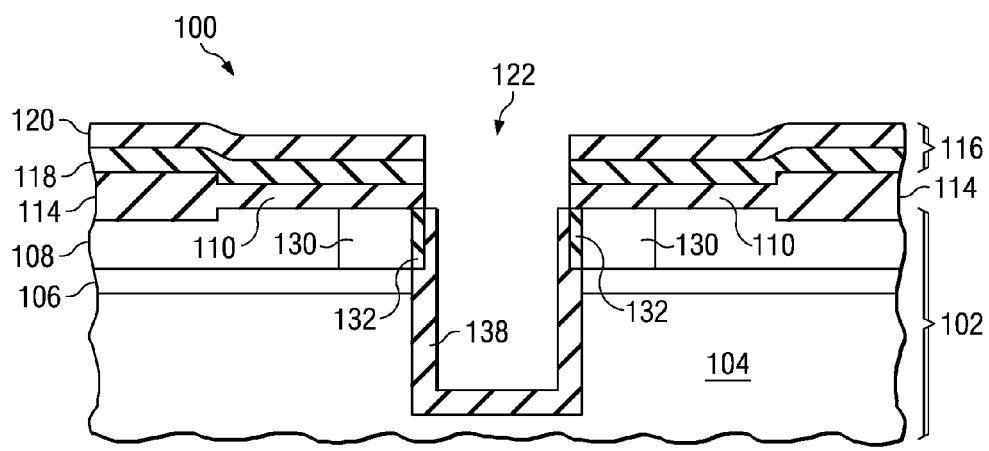
FIGS. 13 through 16 show cross-sectional views of the semiconductor device, wherein a lower portion of the trench ring is lined with an insulating material and the trench ring is filled with a conductive material.

The insulating material 134 optionally may be removed from the sidewalls of the trench 122, as shown in FIG. 13. Alternatively, the insulating material 134 may be left remaining on the sidewalls of the trench 122, for example, not shown. At least a portion of the insulating liner 132 may be left remaining on the sidewalls of the trench 122 beneath the hard mask 116, as shown in FIG. 12, after the removal of the insulating material. Alternatively, the insulating liner 132 may be completely removed from the trench 122 sidewalls during the removal of the insulating material 134, for example, not shown.

An insulating material 138 is formed on sidewalls and a bottom surface of the trench 122, as shown in FIG. 13. The insulating material 138 may comprise about 700 nm of an oxide material, for example, although alternatively, the insulating material 138 may comprise other dimensions and materials. The insulating material 138 may comprise an oxide that is formed by oxidizing the workpiece 102, e.g., by oxidizing the bottom surface and the sidewalls of the trench 122, for example. In other embodiments, the insulating material 138 may comprise an oxide, a nitride, or combinations or multiple layers thereof, for example. The insulating material 138 is formed over and lines the bottom surface and sidewalls of the trench ring 122 formed in the first semiconductive material 104, over the sidewalls of the second semiconductive material 106 or buried layer, and over the sidewalls of the optional insulating liner 132, if present, or over the sidewalls of the sinker contacts 130, if the insulating liner 132 is not present.

Figure 14:
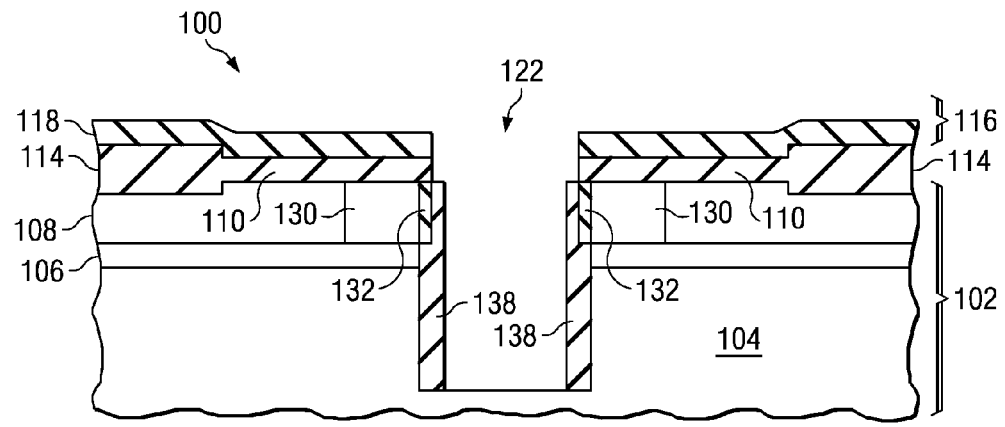

Next, another anisotropic etch process is used to remove the insulating material 138 from the bottom of the trench 122, as shown in FIG. 14. The insulating material 138, and optionally also insulating liner 132, if included, is left remaining on the sidewalls of the trench 122. The sinker contacts 130 are directly adjacent and abutting the insulating materials 132 and 138 disposed on the sidewalls of the trench ring 122. The anisotropic etch process may also result in the material layer 120 of the hard mask 116, which may comprise an oxide material layer, being removed from the top surface of the workpiece 102, also shown in FIG. 14.

The trench 122 is then filled with a fill material 140 comprising a conductive material. The fill material 140 may comprise a semiconductive material such as polysilicon in some embodiments, for example. The fill material 140 may also comprise amorphous silicon, crystalline silicon, a carbon-containing material such as graphite, or other materials, for example. The fill material 140 is coupled to a lower portion of the workpiece 102, e.g., to the first semiconductive material 104. The fill material 140 may comprise a doped semiconductive material, e.g., doped with a similar dopant or a dopant of the same type as a dopant of the first semiconductive material 104, in some embodiments.

Using a fill material 140 comprising the same material as the first semiconductive material 104 of the workpiece 102 may be advantageous in some applications to improve stress properties of the semiconductor device 100 structure, for example. Using a fill material 140 that comprises the same material as the first semiconductive material 104 of the workpiece 102 or has similar stress properties of the first semiconductive material 104 of the workpiece 102 is advantageous because the stress of the first semiconductive material 104 is matched, for example. Alternatively, other materials may be used to fill the trench ring 122, for example.

The fill material 140 is also referred to herein as a fifth semiconductive material in some embodiments. The fifth semiconductive material may comprise the same doping type and/or conductivity type as the first semiconductive material 104 of the workpiece 102, for example.

Figure 15:
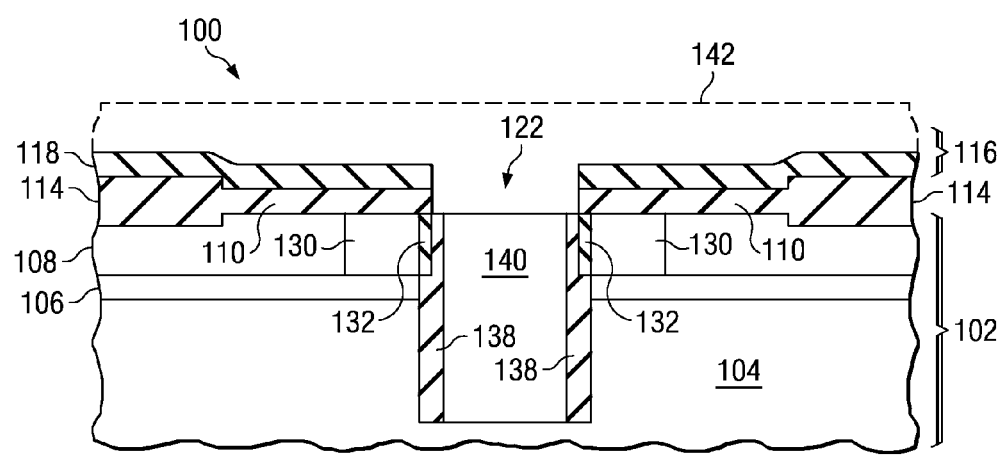

The fill material 140 as deposited may comprise a top surface 142 that is disposed over the top surface of the material layer 118 of the hard mask 116, as shown in FIG. 15 in phantom. An etch process and/or a chemical mechanical polish (CMP) process may be used to remove the excess fill material 140 from over the top surface of the workpiece 102, so that the fill material 140 comprises a top surface that is substantially coplanar with the top surface of the third semiconductive material 108.

Figure 16:
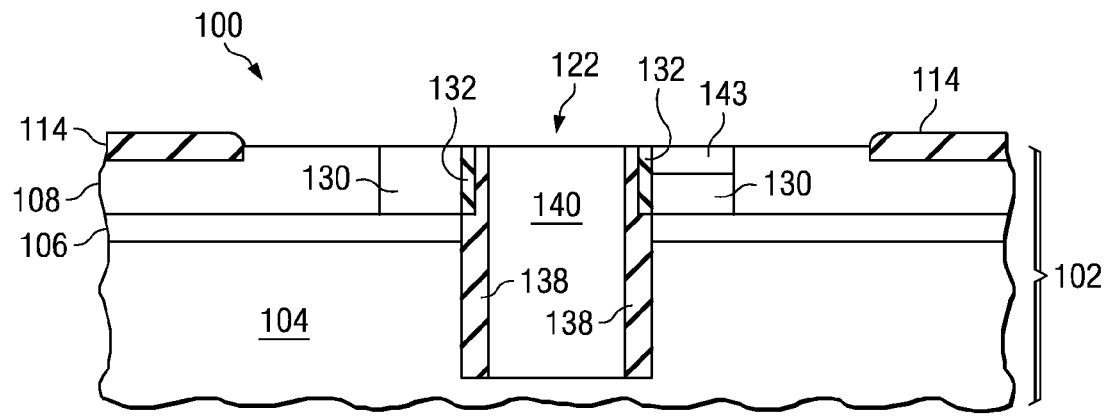

The hard mask 116 is then removed from over the top surface of the workpiece 102, and portions of the oxide material 110 is removed, as shown in FIG. 16, e.g., using an etch process or etch processes. Removing the portions of the oxide material 110 may comprise an etch process that also reduces the thickness of the isolation regions 114, as shown in FIG. 16.

In another optional step, portions 143 of the sinker contacts 130 may be implanted with a dopant to increase the conductivity of the sinker contacts 130 and form sinker contacts 130 comprising a lower ohmic contact, as shown in FIG. 16. For example, a layer of photoresist (not shown) may be formed over the workpiece 102 and patterned using lithography, and exposed portions of the sinker contacts 130 may be subjected to an implantation process to introduce at least one dopant into the top surface of the sinker contacts 130. If the sinker contacts 130 comprise an n type material, the sinker contacts 130 may be implanted with an n+ material, for example. Region 143 may comprise a heavily doped region proximate a top surface of at least a portion of the sinker contact 130, for example.

Only one sinker contact 130 is shown that comprises a heavily doped portion 143 in FIG. 16; alternatively, the sinker contacts 130 on both sides of the trench 122 may be implanted with a dopant to form the heavily doped portions 143, not shown.

Figure 17:
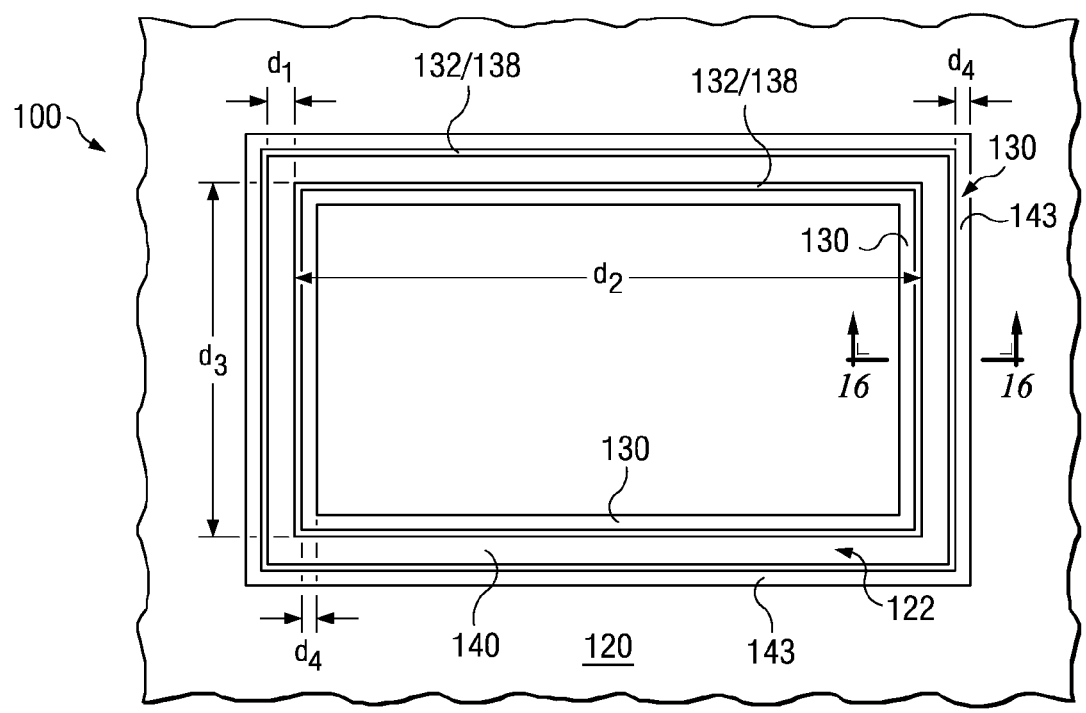
FIG. 17 shows a top view of the semiconductor device, wherein the sinker contacts are formed adjacent sidewalls of the entire trench ring.

FIG. 17 shows a top view of a semiconductor device 100 in accordance with an embodiment of the present invention wherein sinker contacts 130 are formed adjacent sidewalls of the entire trench ring 122. The sinker contacts 130 comprise a first sinker contact 130 formed proximate sidewalls of the interior of the trench ring 122 and a second sinker contact 130 (represented by heavily doped regions 143 of the sinker contact 130 in the top view of FIG. 17) formed proximate sidewalls of the exterior of the trench ring 122. The first and second sinker contacts 130 are separated electrically from the conductive fill material 140 within the trench ring 122 by the insulating materials 132/138 on the sidewalls of the trench ring 122. The sinker contacts 130 are directly adjacent the insulating material 132/138 on the sidewalls of the trench ring 122. In this embodiment, the optional step shown in FIG. 7 used to form the oxide material 124 is not included in the manufacturing process, for example.

Figure 18:
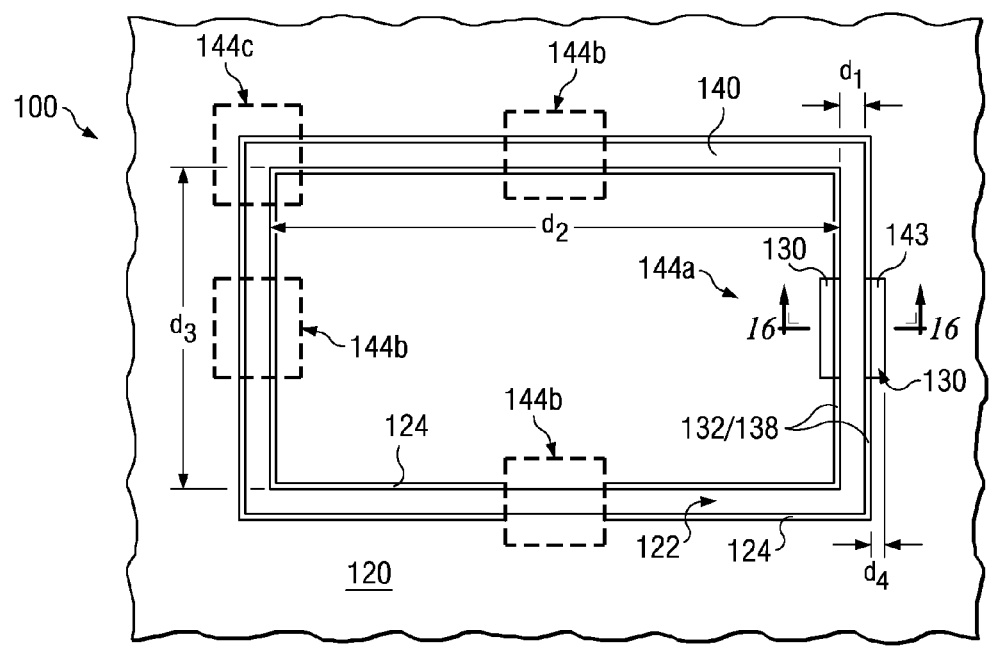
FIG. 18 shows a top view of a semiconductor device, wherein the sinker contacts are formed on at least one portion of the trench ring.

FIG. 18 shows a top view of a semiconductor device 100 in accordance with another embodiment of the present invention, wherein the sinker contacts 130 are formed on at least one portion of the trench ring 122. The sinker contacts 130 may be formed on an interior portion of the trench ring 122 and on an exterior portion of the trench ring 122 (shown at 143) on a single portion of the trench ring 122, as shown in region 144*a*. The sinker contacts 130 may also be formed on a plurality of portions of the trench ring 122, e.g., disposed along the trench ring 122 in regions 144*b* and 144*c*, as shown in phantom. The sinker contacts 130 may also be formed on one or more corners of the trench ring 122, as shown in phantom in region 144*c*.

Figure 19:
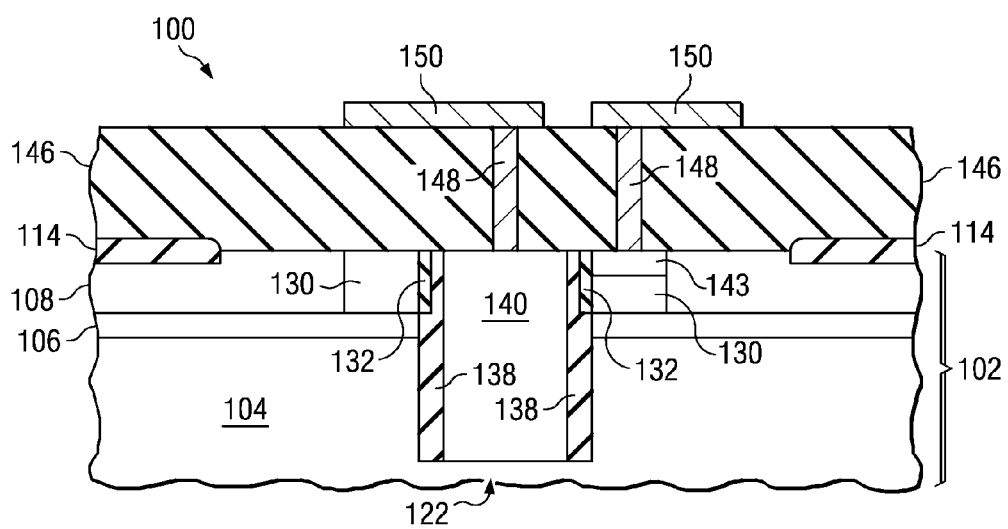
FIG. 19 shows a cross-sectional view of the semiconductor device after subsequent material layers are formed over the semiconductor device and electrical connections are made to the sinker contacts and semiconductive material within the trench ring.

Electrical contact is made to the first semiconductive material 104 by conductive material 140 in the trench ring 122, and electrical contact is made to the second semiconductive material 106 by the sinker contacts 130. For example, FIG. 19 shows a cross-sectional view of the semiconductor device 100 after additional materials 146, 148, and 150 are formed over the semiconductor device 100 and electrical connections are made to the sinker contacts 130 and the conductive material 140 within the trench ring 122. For example, an insulating material 146 may be formed over the workpiece 102, and vias or contacts 148 may be formed in the insulating material 146 to make electrical contact to the conductive material 140 in the trench ring 122 and/or the sinker contact 130. A conductive line or contact pad 150 may be coupled to and formed over the vias or contacts 148, as shown.

The sinker contacts 130 and the conductive material 140 within the trench 122 may provide electrical connection to an active area of the workpiece 102, for example. The semiconductor device 100 may include a conductive line or a conductive pad 150 and/or a contact 148 disposed over and adjacent to the sinker contacts 130 or the conductive material 140 disposed within the trench 122, wherein the at least one sinker contact 130 or the conductive material 140 disposed within the trench 122 provides electrical connection of the conductive line or conductive pad 150 and/or contact 148 to active areas (not shown) of the workpiece 102. The active areas may comprise a portion of a transistor, a diode, a capacitor, a logic device, a memory device, other types of circuit elements, or combinations thereof, for example.

At least one isolation region 114 may be disposed within the third semiconductive material 108 proximate at least one side of the trench ring 122, as shown in the cross-sectional view of FIG. 19. The isolation regions 114 may be formed before or after the formation of the trench ring 122 and/or the sinker contact 130 in accordance with embodiments of the present invention.

Embodiments of the present invention are beneficial when used to form sinker contacts 130, e.g., in bipolar devices. For example, the sinker contacts 130 may be used to make electrical contact to a buried layer 106 that functions as a highly doped sub-collector used in a bipolar transistor. Another example of an application in which embodiments of the present invention may be implemented is in smart power technologies, where a buried layer 106 may provide high voltage isolation from the substrate or first semiconductive material 104. In such applications, the buried layer 106 needs to be electrically connected by a sinker contact 130, for example. Another example of an application in which the novel sinker contacts 130 of embodiments of the present invention may be implemented, which is often found in smart power technologies, for example, is in vertical drain-extended MOS transistors, wherein an extended drain is formed vertically in the epitaxial layer, e.g., the third semiconductive material 108 disposed on top of a buried layer 106. In such applications, the sinker contact 130 may function directly as a drain contact, for example. Alternatively, embodiments of the present invention may be implemented in other applications.

Embodiments of the present invention achieve technical advantages by providing novel structures for sinker contacts 130 and novel methods of manufacture thereof. Embodiments of the present invention include methods of manufacturing semiconductor devices 100 and semiconductor devices 100 manufactured using the methods described herein.

Advantages of embodiments of the present invention include providing novel trench rings 122 and sinker contacts 130 that may be made smaller using the novel manufacturing methods described herein. Because the sinker contacts 130 are formed after a partial etch of the trench ring 122, etching the trench ring 122 through a highly doped area is avoided. Furthermore, because the sinker contacts 130 are formed before the trench rings 122 are completely etched and filled with the conductive material 140, the generation of slip-lines during the high-temperature anneal process for the formation of the sinker contacts 130 is avoided.

Advantageously, the width of trench rings 122 may be reduced in semiconductor device 100 designs so that more of the surface area of the semiconductor device 100 may be used for active areas and other devices and components, rather than for sinker contact 130 and trench ring 122 areas. For example, smaller trench rings 122 may be used (e.g., dimensions $d_2$ and $d_3$ may be reduced), wherein the trench rings 122 are smaller and require less space. Furthermore, adjacent devices in the workpiece 102 may be placed closer to the novel sinker contacts 130 and trench rings 122 described herein.

The sinker contacts 130 and trench rings 122 comprise a novel combination structure for making electrical contact to both the buried layer 106 and the substrate 104, respectively, of the workpiece 102. The sinker contacts 130 are formed proximate the sidewalls of the trench ring 122 rather than being spaced apart from the trench ring 122. The sinker contacts 130 are disposed directly adjacent and abutting the insulating material 132/138 on the sidewalls of the trench 122. The sinker contacts 130 are spaced apart from the conductive material 140 within the trench ring 122 by the thickness of insulating material 132/138, for example. Thus, the sinker contact 130 and trench ring 122 regions of semiconductor devices 100 may be scaled down further in size in accordance with embodiments of the present invention.

The novel sinker contacts 130 and trench rings 122 are easily and inexpensively implementable in manufacturing process flows for semiconductor devices 100. For example, the novel methods and sinker contacts 130 described herein may easily be implemented into existing manufacturing process flows, lithography mask designs, and lithography tools and systems, with few additional processing steps being required for implementation of the invention.

Embodiments of the invention may be implemented in semiconductor applications such as transistors, memory devices, logic devices, mixed signal devices, and other applications, as examples. Embodiments of the present invention are particularly advantageous when used in high voltage transistor applications, e.g., having an operating voltage of about 3 V or greater, for example. Alternatively, the novel sinker contacts 130 and trench rings 122 may also be used in low voltage transistor applications.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
    a semiconductive buried layer disposed between a top portion and a remaining bottom portion of a substrate;
    a trench disposed in the substrate, the trench extending at least through the semiconductive buried layer, wherein the trench comprises a trench ring;
    at least one contact disposed in the top portion of the substrate, the at least one contact being proximate sidewalls of at least a portion of the trench, the at least one contact being adjacent the semiconductive buried layer, wherein the at least one contact comprises:
        a first contact proximate an interior of the trench ring, and
        a second contact proximate an exterior of the trench ring;
    an insulating material disposed on the sidewalls of the trench; and
    a conductive material disposed within the trench coupled to a lower portion of the substrate.

2. The semiconductor device according to claim 1, wherein the at least one contact comprises a conductive region comprising at least one dopant implanted and/or diffused into the top portion of the substrate, wherein the conductive region provides electrical connection from a top surface of the substrate to the semiconductive buried layer.

3. The semiconductor device according to claim 1, further comprising a conductive line, a conductive pad, or a contact disposed over and adjacent to the at least one contact or the conductive material disposed within the trench, and wherein the at least one contact or the conductive material disposed within the trench provides electrical connection of the conductive line, conductive pad, or contact to an active area of the substrate.

4. The semiconductor device according to claim 3, wherein the active area comprises a portion of a transistor, a diode, a capacitor, a logic device, a memory device, another type of circuit element, or combinations thereof.

5. The semiconductor device according to claim 1, wherein the trench comprises a trench ring comprising a continuous loop, wherein the trench ring is disposed about and encloses a portion of the substrate.

6. The semiconductor device according to claim 1, wherein the conductive material disposed within the trench comprises a semiconductor having the same doping type as the bottom portion of the substrate.

7. The semiconductor device according to claim 1, wherein the at least one contact comprises a semiconductor having the same doping type as the semiconductive buried layer.

8. The semiconductor device according to claim 1, wherein the at least one contact comprises a contact of a transistor, a diode, a capacitor, a logic device, a memory device, another type of circuit element, or combinations thereof.

9. A semiconductor device comprising:
    a semiconductive buried layer disposed between a top portion and a remaining bottom portion of a substrate;
    a trench disposed in the substrate, the trench extending at least through the semiconductive buried layer;
    at least one contact disposed in the top portion of the substrate, the at least one contact being proximate sidewalls of at least a portion of the trench, the at least one contact being adjacent the semiconductive buried layer;
    an insulating material disposed on the sidewalls of the trench; and
    a conductive material disposed within the trench coupled to a lower portion of the substrate, wherein the bottom portion of the substrate comprises a first semiconductive material, wherein the semiconductive buried layer comprises a second semiconductive material, wherein the top portion of the substrate comprises a third semiconductive material, wherein the at least one contact comprises a fourth semiconductive material, wherein the conductive material disposed within the trench comprises a fifth semiconductive material, wherein the fifth semiconductive material comprises the same doping type as the first semiconductive material, and wherein the fourth semiconductive material comprises the same doping type as the second semiconductive material.

10. The semiconductor device according to claim 9, wherein the first semiconductive material comprises a p type material, and wherein the second semiconductive material comprises an n type material.

11. The semiconductor device according to claim 9, wherein the first semiconductive material comprises an n type material, and wherein the second semiconductive material comprises a p type material.

12. A semiconductor device comprising:
    a substrate including a first semiconductive material, a second semiconductive material disposed over the first semiconductive material, and a third semiconductive material disposed over the second semiconductive material;
    a trench ring disposed within the substrate extending through the second semiconductive material;
    at least one contact disposed within the third semiconductive material proximate sidewalls of at least a portion of the trench ring, the at least one contact being adjacent the second semiconductive material, the at least one contact comprising a fourth semiconductive material;
    an insulating material disposed on sidewalls of the trench ring; and
    a fifth semiconductive material disposed within the trench ring over the insulating material, wherein the fifth semiconductive material is coupled to the first semiconductive material.

13. The semiconductor device according to claim 12, wherein the at least one contact comprises a plurality of contacts disposed on a plurality of portions of the trench ring.

14. The semiconductor device according to claim 12, wherein the at least one contact comprises:
    a first contact disposed proximate an interior of the trench ring; and a second contact disposed proximate an exterior of the trench ring.

15. The semiconductor device according to claim 14, wherein the first contact is disposed along an entire length of the trench ring, and wherein the second contact is disposed along an entire length of the trench ring.

16. The semiconductor device according to claim 12, wherein the first semiconductive material and the fifth semiconductive material comprise a first conductivity type, and wherein the second semiconductive material and the fourth semiconductive material comprise a second conductivity type, the second conductivity type being different than the first conductivity type.

17. The semiconductor device according to claim 12, further comprising a heavily doped region proximate a top surface of at least a portion of the at least one contact.

18. The semiconductor device according to claim 12, wherein the at least one contact is adjacent the insulating material disposed on the sidewalls of the trench ring.

19. The semiconductor device according to claim 12, further comprising at least one field oxide region, shallow trench isolation (STI) region, or thick oxide region disposed in the third semiconductive material proximate at least one side of the trench ring.

20. The semiconductor device according to claim 12, wherein the at least one contact comprises a contact of a transistor, a diode, a capacitor, a logic device, a memory device, another type of circuit element, or combinations thereof.

21. A semiconductor device comprising:
a semiconductor buried layer of a first doping type disposed between a top portion and a remaining bottom portion of a substrate;
a trench disposed in the substrate, the trench extending at least through the semiconductor buried layer, wherein the trench comprises a trench ring;
a first contact to a first portion of the semiconductor buried layer disposed proximate sidewalls of at least a first portion of the trench, the first contact disposed over the semiconductor buried layer, wherein the first contact is proximate an interior of the trench ring;
a second contact to a second portion of the semiconductor buried layer disposed proximate sidewalls of at least a second portion of the trench, the second contact disposed over the semiconductor buried layer, wherein the second contact is proximate an exterior of the trench ring;
an insulating material disposed on the sidewalls of the trench; and
a conductive material disposed within the trench coupled to a lower portion of the substrate.

22. The semiconductor device according to claim 21, wherein the bottom portion of the substrate has a second doping type opposite to the first doping type.

23. The semiconductor device according to claim 21, wherein the first contact to the semiconductor buried layer has the same doping type as the semiconductor buried layer.

24. The semiconductor device according to claim 21, wherein conductive material comprises a semiconductor, and wherein the bottom portion of the substrate has the same doping type as the conductive material.

25. The semiconductor device according to claim 21, wherein the trench comprises a trench ring, and wherein the first contact is proximate an interior of the trench ring.

26. The semiconductor device according to claim 21, wherein the first contact comprises a contact of a transistor, a diode, a capacitor, a logic device, a memory device, another type of circuit element, or combinations thereof.

* * * * *